(12) United States Patent
Heithoff

(10) Patent No.: US 6,346,854 B1
(45) Date of Patent: Feb. 12, 2002

(54) AMPLIFIER CIRCUIT WITH REDUCED DC POWER RELATED TURN-ON AND TURN-OFF TRANSIENTS

(75) Inventor: Christopher B. Heithoff, Saratoga, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/703,378

(22) Filed: Oct. 31, 2000

(51) Int. Cl.$^7$ .............................. H03F 1/26; H04B 15/00
(52) U.S. Cl. ..................... 330/149; 330/51; 381/94.1
(58) Field of Search .................. 330/51, 149; 381/94.1, 381/94.5, 94.8

(56) References Cited

U.S. PATENT DOCUMENTS

| | | | |
|---|---|---|---|
| 4,433,306 A | * 2/1984 | Honda et al. | 330/297 |
| 4,983,927 A | * 1/1991 | Tarazzina | 330/51 |
| 5,194,821 A | * 3/1993 | Brambilla et al. | 330/51 |
| 5,420,535 A | * 5/1995 | Nebuloni et al. | 330/51 |
| 5,642,074 A | 6/1997 | Ghaffaripour et al. | 330/51 |
| 5,648,742 A | * 7/1997 | Ghaffaripour et al. | 330/51 |
| 5,703,529 A | 12/1997 | Ghaffaripour et al. | 330/51 |
| 5,939,938 A | 8/1999 | Kalb et al. | 330/51 |

* cited by examiner

*Primary Examiner*—Robert Pascal
*Assistant Examiner*—Khanh Van Nguyen
(74) *Attorney, Agent, or Firm*—Merchant & Gould PC

(57) ABSTRACT

An amplifier circuit with improved turn-on transient operation includes a differential amplifier and a selectively variable reference generator for controlling the amplifier output during circuit turn-on. The amplifier is biased by a single power supply and its differential inputs are driven by a first reference voltage from the reference generator and a single-ended input signal. Following circuit turn-on and turn-off, the first reference voltage typically charges to or discharges from, respectively, some fixed value relative to the positive power supply voltage. A comparator detects when the first reference voltage exceeds a second reference voltage and generates a control signal in response to that transition. The second reference voltage is selected to be nearly the steady-state value of the first reference voltage. The control signal (which indicates that the first reference voltage is nearing its steady-state value) is fed to a delay circuit which generates a delayed control signal. The delayed control signal tracks the first reference voltage but is delayed a sufficient amount of time to allow both the bypass capacitor of the reference generator and an input signal coupling capacitor to fully charge before switching a bypass switch on the amplifier and thereby converting the amplifier from a voltage follower to an amplifier. This allows improved turn-on transient operation to be realized, e.g., reduced "pops" and "clicks" upon circuit turn-on, while giving the user increased flexibility in selecting the sizes of the reference voltage bypass capacitor and the input signal coupling capacitor.

23 Claims, 6 Drawing Sheets

AMPLIFIER CIRCUIT WITH REDUCED DC POWER RELATED TURN-ON AND TURN-OFF TRANSIENTS

BACKGROUND OF THE INVENTION

1. Field of the Invention

The present invention relates to analog amplifier circuits, and in particular, to DC-powered, analog amplifier circuits for receiving DC- or AC-coupled input signals and producing DC- or AC-coupled output signals.

2. Description of the Related Art

Referring to FIG. 1, analog amplifiers, such as audio power amplifiers, are often required to operate from a single power supply. In some cases, this means the AC input signal (VIN) must be AC-coupled to the input of the amplifier circuit since the internal reference for the amplifier circuit is at a DC voltage between DC circuit ground and the power supply potential, e.g., at a value equal to one-half of the applied DC power supply voltage. This DC reference is established by a voltage source, often in the form of a resistive voltage divider (R1 and R2) with a bypass capacitor (CB) for charging to and maintaining the DC reference voltage across the lower resistor. (In this particular circuit, as is often the case for audio power amplifiers, two serially cascaded inverting amplifiers are used in a bridge-tied-load ("BTL") configuration to drive a load, e.g., a speaker, with a differential output signal.)

However, this type of circuit suffers from a problem due to the necessity of having an AC-coupled input. Upon application of DC power (V+) to this circuit, the bypass capacitor begins to charge, as does the input coupling capacitor (CC) which is grounded at the input side by the output impedance of the grounded input signal source. This results in the two capacitors having, at any given points in time during their charging or discharging periods, different voltages across them. In turn, this causes a transient signal to appear across the load. For example, during initial circuit turn-on, the current for charging the input coupling capacitor flows from the output of the first amplifier through its feedback (RF1) and input (RI1,) resistors. The resulting signal at the output of the first amplifier appears at the load in the "negative" portion (VOUT−) of the differential output signal, with the "positive" portion (VOUT+) applied by the second, cascaded inverting amplifier. This initial signal across the load is a turn-on transient which in the case of an audio power amplifier produces a "click" or "pop" from the speaker. Similarly, during circuit turn-off, a turn-off transient produced by unequal discharging of the capacitors may produce a "click" or "pop" from the speaker as well.

Similar turn-on and turn-off transients occur in single-ended load ("SEL") circuits, i.e., those amplifier circuits in which a single-ended output signal is provided to a grounded load (e.g., either VOUT− or VOUT+ only) rather than a differential output signal to a load isolated from circuit ground. Indeed, whereas in a BTL configuration the outputs may track each other during startup and thereby avoid producing a "pop," an SEL configuration will virtually always produce a "pop" unless the output bias reference is at DC ground.

Conventional amplifier circuits have been developed which address this "pop" problem in a number of different ways. One approach has been to avoid using single power supply circuits by biasing the amplifier circuit between equal positive and negative power supply voltages with the output driving a grounded load. This allows the input coupling capacitor to be eliminated, thereby eliminating the cause of the turn-on and turn-off transients. However, this requires a second power supply which increases system complexity and costs. Another approach has been to apply the single DC power supply voltage in a gradual manner to initiate the flow of DC bias currents within the amplifiers. However, this results in the amplifier circuit having an indeterminate state of operation during turn-on and turn-off. Further, turn-on and turn-off transients can still occur when power is removed and quickly reinstated as in when a system reset is performed.

Accordingly, it would be desirable to have an analog amplifier which can be operated with a single power supply and reduced DC power related transients.

SUMMARY OF THE INVENTION

An amplifier circuit for operating with a selectively variable reference voltage for reducing turn-on and turn-off transients in accordance with the present invention significantly reduces transients in its output signal due to circuit turn-on and turn-off while providing increased flexibility in the selection of values for the reference voltage bypass capacitor and the input signal coupling capacitor. Output signal transients during circuit turn-on and turn-off are more easily predicted due to simpler relationships between circuit variables and the transient output signal waveform, and circuit turn-on and turn-off times can be decreased with less significant increases in output signal transients.

An amplifier circuit for operating with a selectively variable reference voltage for reducing turn-on transients in accordance with one embodiment of the present invention includes an amplifier, a reference generator, and a controller. The amplifier is configured to operate in either a first mode, wherein the amplifier acts as a voltage follower with respect to a first reference voltage, or in a second mode, where the amplifier amplifies an input signal. The amplifier is changed from its first mode to its second mode through the selection of a switch. The switch is controlled by the controller which generates a delayed control signal indicative that the first reference voltage has risen above a fixed, second reference voltage. The delayed control signal is delayed a sufficient amount of time to allow the DC transients in the circuit to dampen before switching the amplifier from its first mode to its second mode.

In accordance with another embodiment of the present invention, the amplifier is further configured to operate in either a turned-on or a shutdown mode of operation, determined by a shutdown signal provided by a controller. A shutdown event causes a first reference voltage to move from its steady state value toward a second value. The controller compares the moving first reference voltage with a fixed second reference voltage to detect that the shutdown event has been triggered. In response to that determination, the controller generates a delayed control signal, and provides that delayed control signal to the amplifier. The controller is configured to generate the delayed control signal a sufficient amount of time after the detection of the shutdown event to allow the DC transients in the circuit to dampen before switching the amplifier from its second mode to its first mode.

These and other features and advantages of the present invention will be understood upon consideration of the following detailed description of the invention and the accompanying drawings.

DETAILED DESCRIPTION OF THE INVENTION

Figure 1:
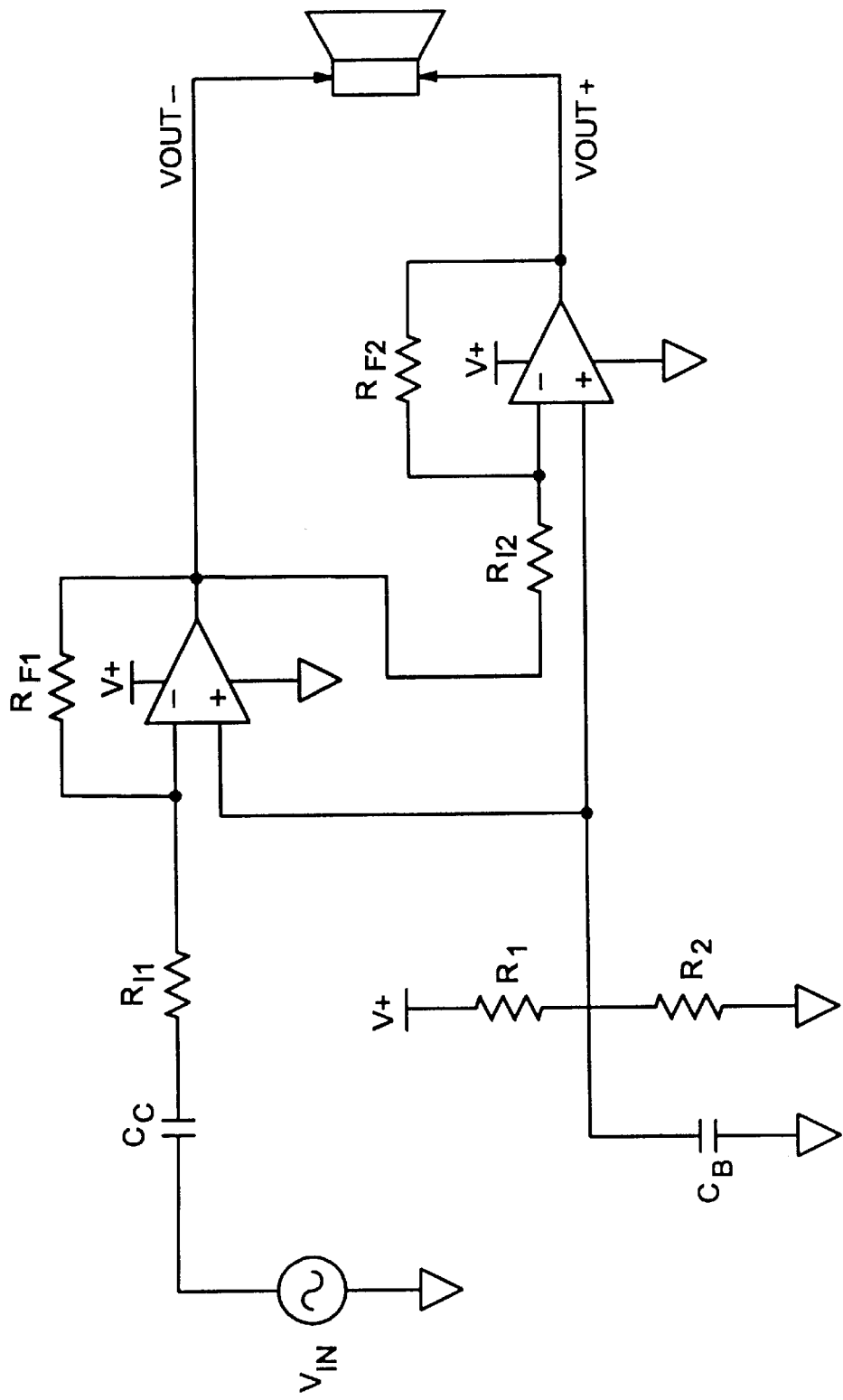
FIG. 1 is a schematic diagram of a conventional analog amplifier circuit for amplifying audio signals in a bridge-tied-load ("BTL") configuration.
Figure 2:
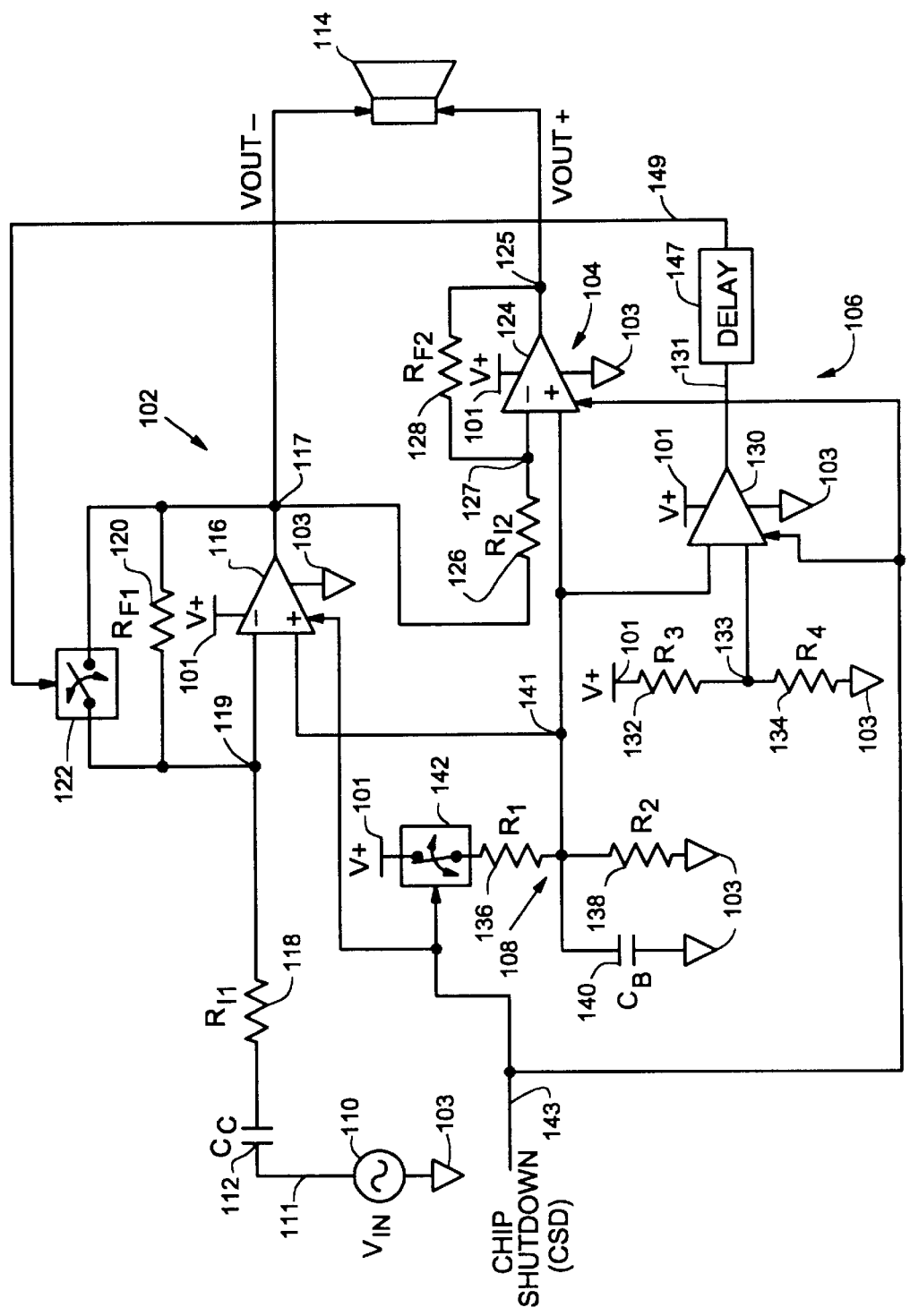
FIG. 2 is a schematic diagram of an analog amplifier circuit in a BTL configuration including features in accordance with one embodiment of the present invention.

Referring to FIG. 2, an amplifier circuit 100 including features in accordance with one embodiment of the present invention includes a first amplifier 102, a second amplifier 104, a controller 106 and a reference generator 108. As discussed in more detail below, the first amplifier 102 has a controllable gain which is controlled by the controller 106. Based on the values of two reference voltages provided by the reference generator 108, the controller 106 establishes the gain of the first amplifier 102. The amplifier circuit 100 is driven by an AC signal source 110 through a coupling capacitor 112 and drives a load 114, e.g., a speaker. The first amplifier 102 provides an output signal VOUT− which drives the input to the second amplifier 104 and the load 114. The second amplifier 104 is an inverting amplifier with a gain of unity and provides an output signal VOUT+ which is substantially equal in magnitude and inverse in phase to the first output signal VOUT−. These two output signals VOUT−, VOUT+ form the "positive" and "negative" phases of a differential output signal provided to the load 114. It should be understood, however, that in accordance with the following discussion and the present invention, the load 114 can, alternatively, be a grounded load (e.g., an ac-grounded load, or a dc-grounded load which is capacitively coupled to the amplifier output) which is driven by only the output signal VOUT− from the first amplifier 102. Although the following discussion is in terms of an inverting amplifier, it should be understood that the principles of the present invention are equally applicable to a noninverting amplifier as well.

The first amplifier 102 includes an operational amplifier (Op-Amp) 116, an input resistor 118, a feedback resistor 120, and a feedback switch 122, connected substantially as shown. Similarly, the second amplifier 104 includes an Op-Amp 124, an input resistor 126, and a feedback resistor 128, connected substantially as shown. In accordance with well known Op-Amp principles, the two amplifiers 102,104 are inverting amplifiers with their respective voltage gains determined by the ratios of their feedback resistors to their input resistors. As noted above, the second amplifier 104 has a gain of one (unity). Therefore, its input 126 and feedback resistors 128 have equal values (RI2=RF2). The input 118 and feedback 120 resistors for the first amplifier 102 can be selected to provide the desired signal gain for the amplifier circuit. The controller 106 includes a voltage comparator 130 and a delay circuit 147. Two exemplary delay circuits are illustrated in detail in FIGS. 5 and 6, and described below. Briefly described, the delay circuit 147 may be any circuit capable of producing an output signal that tracks an input signal but is delayed by some amount of time. One example of such a delay circuit is a ring oscillator with a divide-by-N ripple counter. The reference generator 108 includes two resistive voltage dividers. The first resistive voltage divider includes serially-connected resistors 136, 138, a switch 142 connected between the power supply voltage 101 and resistor 136, and a bypass capacitor 140 connected in parallel with resistor 138. The second resistive voltage divider includes two serially-connected resistors 132,134 between the power supply voltage 101 and circuit ground 103.

Common to the active portions of the amplifier circuit 100, including the individual amplifiers 116, 124, is a Chip ShutDown (CSD) control signal which is asserted following a "turn off" mode of operation to shut down the circuit and/or devices which draw supply current during normal operation. This mode of operation cuts the power supply current drain to virtually zero without requiring the power supply itself to be turned off or disconnected.

In the initial off state, the CSD control signal 143 is asserted causing switch 142 to be in its open position and feedback switch 122 to be in its closed position. The primary reference voltage 141 across the bypass capacitor 140 is initially zero due to the initially discharged state of the bypass capacitor 140. The amplifier circuit 100 is turned on by deasserting the CSD control signal 143, which closes switch 142, thereby applying the power supply voltage V+ 101 to the Op-Amps 116, 124, the comparator 130, and the reference resistors 136, 138, 132, 134. In this embodiment, the CSD control signal 143 is also used, as shown, to control the turn-on and turn-off of the Op-Amps 116, 124 and the comparator 130, e.g., in accordance with the technique disclosed in commonly assigned U.S. Pat. No. 5,436,588, entitled "Click/Pop Free Bias Circuit," issued on Jul. 25, 1995. Closing the switch 142 causes the primary reference voltage 141 to charge toward its steady state value based on the ratio of the lower resistor 138 to the sum of the resistors 136, 138. Meanwhile, however, the secondary reference voltage 133 is at its full value immediately, as determined by the ratio of the lower resistor 134 to the sum of the resistors 132, 134 (the secondary reference voltage 133 may be typically selected to be slightly less than the fully charged value of the primary reference voltage 141). The comparator 130 compares these two reference voltages 141, 133 and provides an output control signal 131 based on the comparison to the delay circuit 147. The delay circuit 131 provides an output control signal 149 to the switch 122 in the first amplifier. As discussed in detail later, the output signal 149 of the delay circuit 147 is equal to the control signal 131 from the comparator 130 delayed by a predetermined time.

Initially, when the primary reference voltage 141 is less than the secondary reference voltage 133, the control signal 131 is passed through the delay circuit 147 and causes the feedback switch 122 to be in its closed, e.g., shorted, state, thereby bypassing the feedback resistor 120. This causes the first amplifier 102 to function as a voltage follower with respect to its non-inverting input which receives the primary reference voltage 141. Therefore, the output voltage 117 of the first amplifier 102 is equal to its input voltage, i.e., the primary reference voltage 141. This results in equal voltages being applied to the inverting and non-inverting inputs of the second Op-Amp 124, thereby causing its output voltage 125 to also equal the primary reference voltage 141. Accordingly, the two output signals VOUT−, VOUT+ to the load 114 are equal, thereby resulting in a net zero differential signal to the load 114.

Eventually, as the bypass capacitor 140 charges to its steady state voltage, the primary reference voltage 141 surpasses the secondary reference voltage 133. The comparator 130 senses this and adjusts its output control signal 131 accordingly. However, the control signal 131 from the comparator 130 is input to and delayed by the delay circuit 147 so that the feedback switch 122 in the first amplifier 102 does not change state until the predetermined delay of the delay circuit 147 has expired. Thus, when the primary reference voltage 141 exceeds the secondary reference voltage 133 the comparator control signal 131 changes state. That control signal 131 is delayed by the delay circuit 147 and then passed through to the feedback switch 122 causing the feedback switch 122 to switch to its open or high impedance state, no longer bypassing the feedback resistor 120. The amplifier circuit 100 is then configured for its normal, steady state AC signal operation. The AC input signal 111, coupled through the coupling capacitor 112, is amplified by the amplifiers 102, 104 and applied to the load 114.

It should be understood that each of the switches (e.g., 122, 142, and the like) can be realized in a number of different ways. For example, simple electromechanical relays can be used. Alternatively, solid state switches in the form of transistors can be used. For instance, metal oxide semiconductor field effect transistors (MOSFETs) can be used in the form of pass gates or transmission gates (both of which are well known in the art) with the control signal 131 accordingly being a single-ended or differential signal, respectively. Further, the comparator control signal 131 and the delay control signal 149 can simply be binary, e.g., with high and low voltage values, or, alternatively, "trapezoidally-shaped" signals with slower, predetermined rise and fall times to turn on and off the switches 142, 146 in a slower, more controlled manner. The latter type of signal can be particularly advantageous when the switches 142, 146 are solid state and it is desirable for the switches 142, 146 to have a finite serial impedance associated therewith when transitioning between their full-on and full-off states.

In summary, the amplifier circuit 100 introduces a delay between the time that the bypass capacitor 140 stops charging and the time that the feedback switch 122 is opened. By tuning the delay circuit 147 appropriately, the input capacitor 112 is given enough time to fully charge before the feedback switch 122 is opened. In this way, a virtually net-zero differential signal is applied across the load 114, resulting in no turn-on transients being presented to the load 114, and, hence, no turn-on clicks or pops. Similarly, it should be understood that where the load 114 is a grounded load and a single-ended output signal (i.e., either VOUT– or VOUT+) is applied, virtually no turn-on transients occur. During turn-on, the output signal equals the primary reference voltage 141 which is initially zero and then subsequently a slowly charging DC voltage.

The above-discussed amplifier circuits use two inverting amplifiers connected in series to generate the differential output signal for driving the load. However, it should be understood that other amplifier circuit configurations can be used in accordance with the principles of the present invention. For example, two amplifiers connected in parallel, one inverting and the other noninverting, can be used as well whereby the amplifiers share a common input signal and provide the two opposing phases of the differential output signal.

Figure 3:
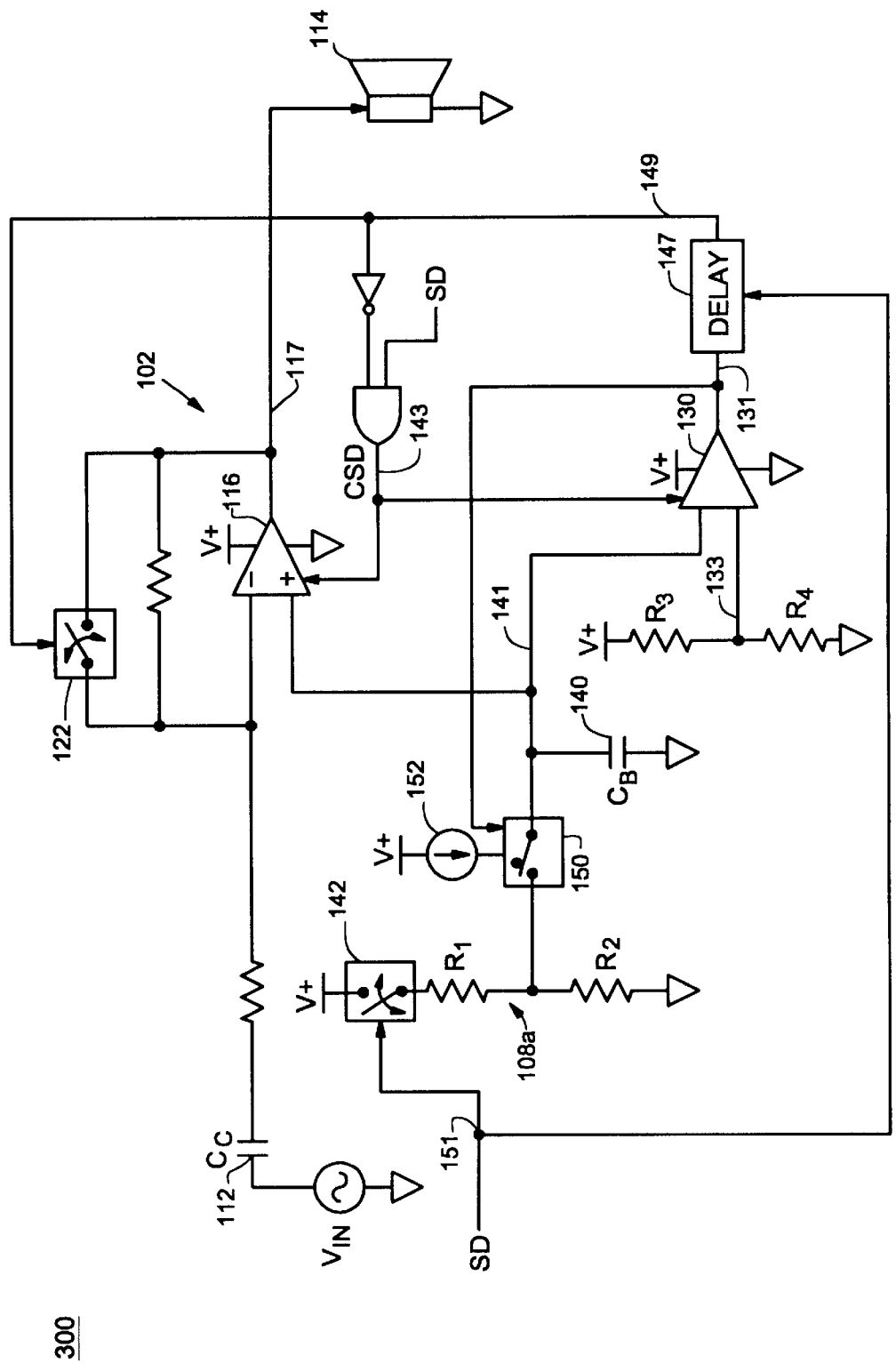
FIG. 3 is a schematic diagram of an analog amplifier circuit in a single-ended load ("SEL") configuration including features in accordance with another embodiment the present invention.

Referring to FIG. 3, the delay circuit 147 may also be used in a single-ended load (SEL) amplifier circuit 300. For example, a grounded load 114 may be driven by the output signal VOUT– (or VOUT+) from one of the amplifiers, such as amplifier 116, of the amplifier circuit 100 (FIG. 2). In addition, an improved reference generator 108a includes two-position switch 150 and a current source 152 connected between serially-connected resistors R1, R2 and the bypass capacitor 140. The two-position switch 150 has a first position which connects the current source 152 to node 141, and a second position which disconnects the current source 152 and connects resistors R1 and R2 to node 141.

When the SEL amplifier circuit 300 is in its off state (e.g., a ShutDown "SD" control signal 143 is asserted), the feedback switch 122 is closed, switch 142 is open, and the two-position switch 150 connects the current source 152 to node 141. Thus, with the feedback switch 122 closed, the amplifier 102 acts as a voltage follower with respect to its non-inverting input which receives the primary reference voltage 141. Therefore, the output voltage 117 of the amplifier 102 is equal to its input voltage, i.e., the primary reference voltage 141.

When the SEL amplifier circuit 300 is turned on, such as by deasserting an SD control signal 151 and applying DC power V+, the switch 142 is closed and the bypass capacitor 140 begins charging. In this embodiment, the current source 152 provides a constant current to the primary reference voltage 141 which allows the bypass capacitor 140 to charge in a substantially linear fashion. Eventually, the bypass capacitor 140 voltage surpasses the secondary reference voltage 133, so the primary reference voltage 141 surpasses the secondary reference voltage 133. The comparator 130 senses this and adjusts its output control signal 131 accordingly. The output control signal 131 is tied to the trigger of two-position switch 150, and, thus, when the primary reference voltage 141 exceeds the secondary reference voltage 133, the comparator output control signal 131 causes the two-position switch 150 to change states and reconnect the primary reference voltage 141 to the voltage divider of resistors R1 and R2.

Again, as with the BTL amplifier circuit illustrated in FIG. 2, the comparator control signal 131 is fed to the delay circuit 147, which delays the control signal 131 some predetermined time and then passes the signal as delayed control signal 149 to the feedback switch 122. As mentioned above, the delay circuit 147 is tuned to delay the comparator control signal 131 a sufficient time to allow both the bypass capacitor 140 and the input capacitor 112 to charge prior to opening the feedback switch 122. Once the feedback switch 122 is opened, the amplifier 102 is then configured for its normal, steady state AC signal operation. The AC input signal 111, coupled through the input capacitor 112, is amplified by the amplifier 102 and applied to the load 114.

Now that the amplifier circuit 300 is operating normally, the feedback switch 122 is open, the switch 142 is closed, and the two-position switch has coupled the voltage divider of resistors R1 and R2 to the primary reference voltage 141. When the amplifier circuit is turned off, (e.g., with an externally-asserted shutdown signal used to initiate the turn-off mode), the switch 142 is opened allowing the bypass capacitor to begin discharging through a discharge resistor (R2). As the primary reference voltage 141 falls below the secondary reference voltage 133, the comparator 130 switches states causing the comparator control signal 131 to change states. The comparator control signal 131 thus resets the two-position switch 150 to connect the current source 152 to the bypass capacitor 140 ready for the next turn-on operation. In addition, the comparator control signal 131 is fed to and delayed by the delay circuit 147, which passes the signal (after a predetermined delay) to the feedback switch 122, causing the feedback switch 122 to close after the bypass capacitor 140 has had enough time to discharge to its substantially turned-off voltage. It should be appreciated that the delay circuit may be tuned to provide a different amount of delay during a turn-on operation versus a turn-off operation. For example, the SD control signal 151 may be fed to the delay circuit 147 and used with appropriate logic within the delay circuit to determine whether the comparator control signal 131 is changing due to a turn-on or a turn-off situation.

Figure 4:
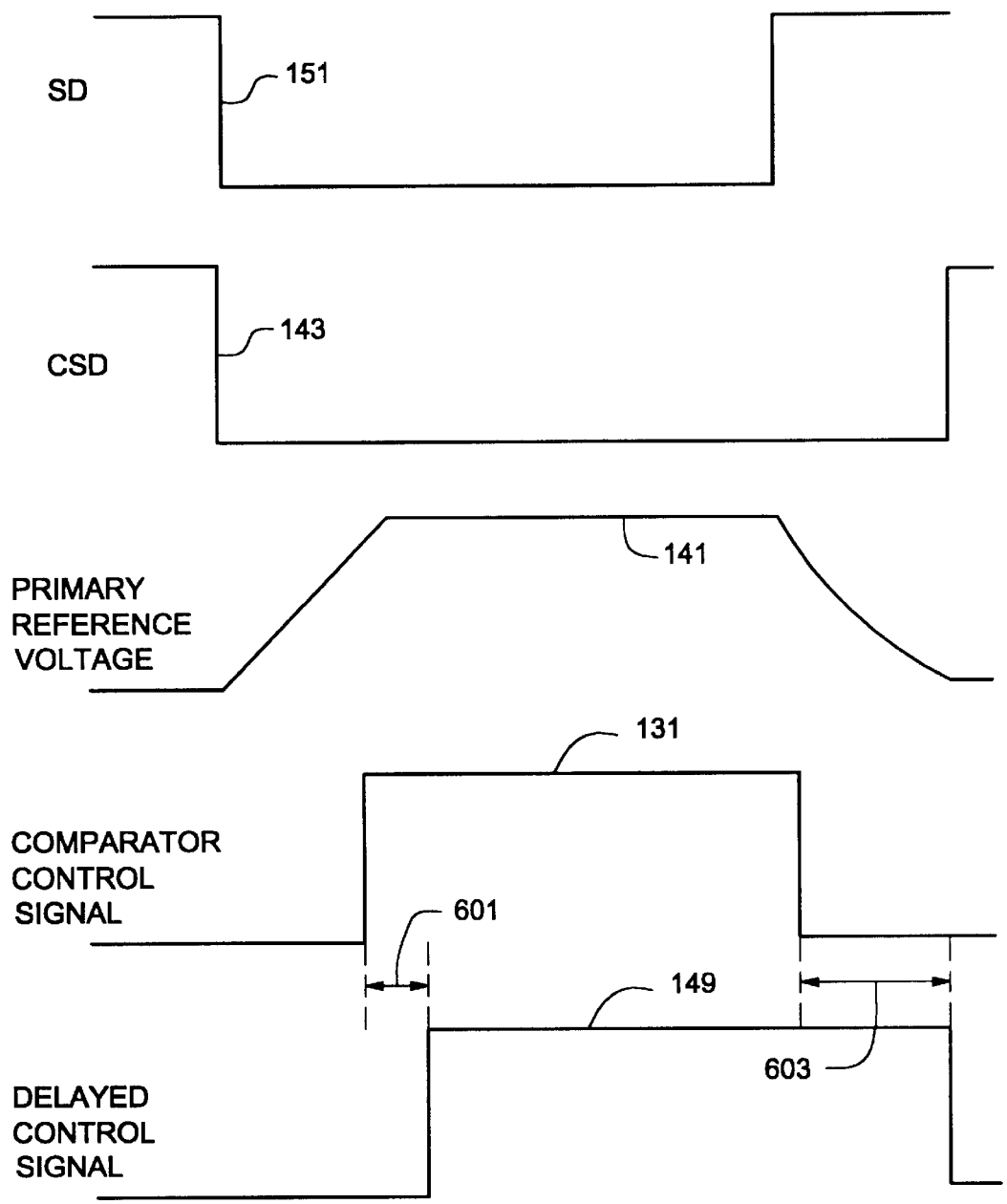
FIG. 4 is a timing diagram of voltages at particular nodes of the amplifier circuit illustrated in FIG. 3.

In addition, in this embodiment, the CSD control signal 143 is generated by "ANDing" the delayed comparator control signal 149 (inverted) with the SD control signal 151. Thus, the current drawing components will be shutdown only when the SD control signal 151 is asserted and the delayed comparator control signal 149 is not asserted. This allows the voltages within the amplifier circuit to change to their steady state before the amplifier 102 receives the CSD control signal 143. It will be appreciated that this circuitry may equally be adapted for use in the BTL amplifier configuration described above in order to achieve the turn-off performance of the SEL amplifier circuit FIG. 4 is a waveform timing diagram of voltages at particular nodes of the amplifier circuit of FIG. 3 to help explain the transitions that occur over time. At an initial time, the SD control signal goes low, indicating that the amplifier circuit is turning on. This transition causes the CSD control signal to go low, thus turning on the appropriate components of the circuit, such as the amplifier 102 and the comparator 130. In addition, the SD control signal switches switch 142 so that the bypass capacitor (node 141) begins to charge. When the bypass capacitor 140 reaches a sufficient voltage, the comparator control signal 131 changes state (from high to low in this example). That signal is fed to the delay circuit 147 which introduces a turn-on delay 601 and then passes the signal to the feedback switch 122. The delayed signal causes the feedback switch 122 to open, thus enabling the amplifier 102.

When the SD control signal 151 goes high (indicating that the circuit is turning off), the switch 142 opens and the bypass capacitor 140 begins to discharge, bringing the primary reference voltage 141 down below the secondary reference voltage 133, resulting in the comparator control signal 131 going low. After the predetermined turn-off delay 603, the delayed control signal 149 goes low, causing the feedback switch 122 to close and the CSD control signal 143 to assert, thereby turning off the components of the amplifier circuit.

Figure 5:
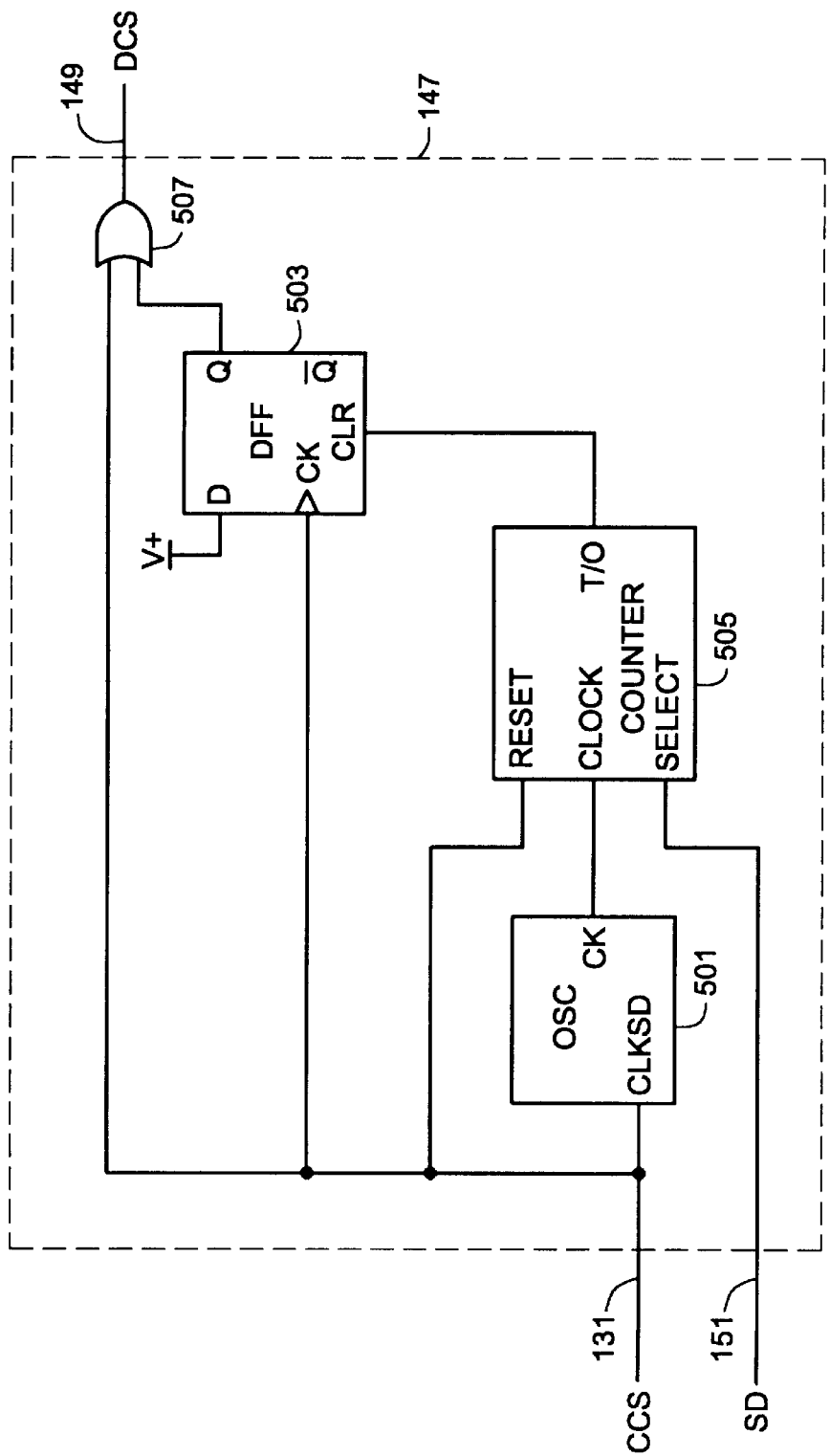
FIG. 5 is a simplified schematic diagram of an analog delay circuit that may be used in one embodiment of the present invention to delay a control signal.

FIG. 5 is a simplified schematic diagram of an analog delay circuit 147 that may be used in one embodiment of the present invention to delay a control signal. The delay circuit 147 receives as input SD 151 and the comparator control signal 131, and outputs the delayed control signal 149. As can be seen, the comparator control signal 131 is input to an oscillator 501, the clocking input of a D-type flip flop (DFF) 503, the reset input of a counter 505, and an OR gate 507. The output of the oscillator 501 is used to clock the counter 505. The output of the counter 505 i used to clear the DFF 503, and the input of the DFF 503 is tied high (e.g., to the power supply voltage V+). The non-inverted output of the DFF 503 is also input to the OR gate 507.

In operation, a transition of the comparator control signal 131 (such as from high to low) starts the oscillator 501, resets the counter 505, and clocks the high signal of the DFF 503 to the output and, hence, to one input of the OR gate 507. At this point, one input of the OR gate 507 is at the same logical state as the comparator control signal 131 (low in this example); however, because the DFF 503 was also clocked high by the same transition of the comparator control signal 131, the OR gate 507 continues to output a logical high signal. Meanwhile, the output of the oscillator clocks the counter 505 until the counter reaches timeout (a predetermined number of clock oscillations). When the counter 505 times out, the output of the counter 505 clears the DFF 503 causing the output of the DFF 503 to change state. At this point, both inputs of the OR gate 507 are at a logic low and, thus, the output of the OR gate 507 transitions to the logic low state thereby causing the delayed control signal 149 to follow the comparator control signal 131. It will be appreciated that the oscillator oscillates at a sufficient frequency (e.g., 50 kHz) to cause the counter 505 to timeout a sufficient amount of time, such as the time necessary for the bypass capacitor 140 (FIG. 3) to charge to its steady state value. For instance, in one embodiment, a 20 ms second delay may be sufficient. In addition, the SD control signal 151 may be input to the counter 505 and used to select between two different time delays. For example, the SD control signal 151 may be used to select between two inputs of a 2:1 multiplexer (not shown), where the two inputs are associated with different timeout values for the counter 505.

Figure 6:
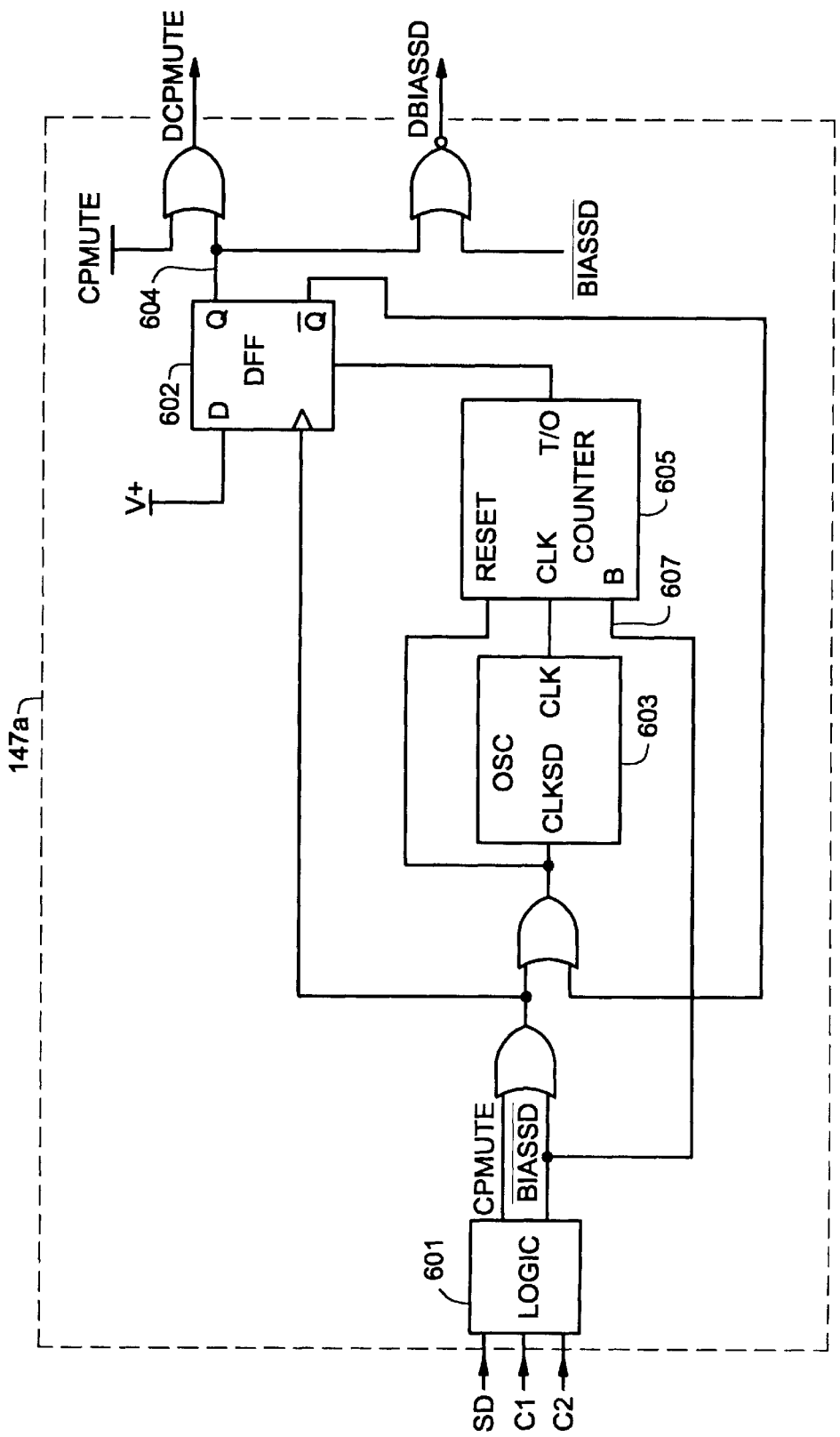
FIG. 6 is a schematic diagram of another analog delay circuit that may be used in another embodiment of the present invention to delay a control signal.

FIG. 6 is another schematic diagram which illustrates yet another embodiment of a delay circuit 147a that may be used with the present invention. The delay circuit 147a differs from the delay circuit 147 illustrated in FIG. 5 in that two control signals (CPMUTE and $\overline{\text{BIASSD}}$) are generated by delay logic 601. The delay logic 601 receives as input the SD control signal and the outputs C1 and C2 of two comparators. In this embodiment, two comparators are used in the amplifier circuit to provide hysteresis so that the change in bypass voltage will cause a transition at different voltage points for turn-on and turn-off The outputs (C1, C2) of those two comparators are fed to the delay logic 601, which then creates the control signal CPMUTE having a falling edge when the bypass capacitor charges to a sufficient voltage above the secondary reference voltage 133 (turn-on) and the control signal $\overline{\text{BIASSD}}$ having a falling edge when the bypass capacitor discharges to a sufficient voltage below the secondary reference voltage 133 (turn-off). As with the delay circuit 147 described above, a high to low transition of either of those control signals (CPMUTE or $\overline{\text{BIASSD}}$) clocks a D-type flip flop (DFF) 602 so that its output 604 is at logic high, and activates an oscillator 603 that acts as a clock for the counter 605. Also as above, the transition of either control signal (CPMUTE or $\overline{\text{BIASSD}}$) causes the counter 605 to reset. The control signal $\overline{\text{BIASSD}}$ is fed to a select input 607 of the counter 605 to determine the number of clock cycles before the counter 605 times out.

When the counter 605 times out, the output of the counter 605 is fed to and clears the output 604 of the DFF 602, which when ORed with the original control signals (CPMUTE or $\overline{\text{BIASSD}}$) creates the delayed control signals DCPMUTE and DBIASSD (not inverted), respectively. Those delayed control signals may then be used in the amplifier circuits (FIGS. 2, 3) to control either the feedback switch 122 or the CSD control signal 143, depending on whether a turn-on or turn-off condition has occurred.

Various modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

I claim:

1. An amplifier circuit for operating with a single power supply, comprising:
   a first amplifier having a controllable gain and being configured to be biased between a power supply voltage and a circuit ground, to receive a first reference voltage having a value between the power supply voltage and the circuit ground, to receive a first input signal, and to selectively operate in either a first mode in which an output signal of the first amplifier is substantially equal to the first reference voltage or in a second mode in which the output signal is substantially equal to a sum of the first reference voltage and a multiple of the first input signal;
   a controller configured to receive the first reference voltage and a second reference voltage, the controller being further configured to generate a control signal based on a comparison of the first reference voltage with the second reference voltage; and
   a delay mechanism, coupled to the controller and the first amplifier, configured to receive the control signal from the controller and to provide to the first amplifier a delayed control signal that is substantially equal but delayed in time to the control signal, the delayed control signal being operative to select between the first mode of the first amplifier and the second mode of the first amplifier,
   wherein, a turn-on event causes the controller to detect a change in the comparison of the first reference voltage and the second reference voltage, and in response to that change to generate the control signal, and further
   wherein the delay mechanism receives the control signal generated by the controller, delays the control signal by a predetermined delay, and, at the expiration of the predetermined delay, provides the delayed control signal to the first amplifier which switches between the first mode of operation and the second mode of operation based on the state of the delayed control signal.

2. The amplifier circuit of claim 1, further comprising a second amplifier connected to the first amplifier in a differential amplifier configuration.

3. The amplifier circuit of claim 2 wherein the first amplifier and the second amplifier are connected in a bridge-tied-load configuration.

4. The amplifier circuit of claim 1 wherein the first amplifier is connected to a load in a single-ended-load configuration.

5. The amplifier circuit of claim 1 wherein the first amplifier comprises an amplifier with an adjustable gain control element that switches the first amplifier between the first mode and the second mode.

6. The amplifier circuit of claim 5 wherein the adjustable gain control element comprises a switch.

7. The amplifier circuit of claim 1 wherein the controller comprises:
   a control circuit configured to receive the first and second reference voltages and to provide a control signal, based on the first and second reference voltages, to a multiple-state device, the multiple-state device being coupled to the delay mechanism and being further configured to operate in one of a plurality of states determined by the control signal.

8. The amplifier circuit of claim 7 wherein the multiple-state device comprises a voltage comparator.

9. The amplifier circuit of claim 1 wherein the delay mechanism comprises an oscillator.

10. The apparatus of claim 9 wherein the delay mechanism further comprises a counter clocked by the output of the oscillator.

11. An amplifier circuit for operating with a single power supply, comprising:
    at least one current drawing component having a shutdown mode of operation, the shutdown mode of operation being selectable by a chip shutdown control signal;
    a reference generator including a capacitor for biasing between a power supply voltage and a circuit ground and configured to provide first and second reference voltages having values between the power supply voltage and the circuit ground, wherein the first reference voltage is initially at an initial reference value and subsequently moves toward a final reference value, the second reference voltage being at a potential between the initial reference value and the final reference value;
    a controller, coupled to the reference generator, for receiving the first and second reference voltages and configured to provide a control signal based on a comparison of the first and second reference voltages; and
    a delay mechanism configured to receive the control signal and to output the chip shutdown control signal substantially equal in state to but delayed in time from the control signal from the controller, wherein
    a turn-off event causes the first reference voltage to move from the initial reference value toward the final reference value causing the controller to generate the control signal, and further wherein the delay mechanism outputs the chip shutdown control signal.

12. The amplifier circuit of claim 11 wherein the current drawing component comprises a first amplifier, coupled to the reference generator and the controller, for biasing between the power supply voltage and the circuit ground and for receiving the first reference voltage and a first input signal, and in accordance therewith for providing a first output signal, wherein the first output signal is substantially equal to the first reference voltage as the first reference voltage initially moves from the initial reference value toward the final reference value, and the first output signal becomes substantially equal to a sum of the first reference voltage and a multiple of the first input signal as the first reference voltage moves past the second reference voltage.

13. The amplifier circuit of claim 12 wherein the reference generator comprises a capacitor for selectively charging or discharging the first reference voltage from the initial reference value toward the final reference value.

14. The amplifier circuit of claim 12 wherein the controller comprises a voltage comparator.

15. The amplifier circuit of claim 12 wherein the delay mechanism comprises an oscillator triggered by the control signal.

16. The amplifier circuit of claim 15 wherein the delay mechanism further comprises a counter clocked by the output of the oscillator.

17. A method of amplifying a signal using a single power supply and a controllable gain, comprising:
    providing an output signal from an amplifier, the amplifier selectively operating in either a first mode or a second mode;
    comparing a first reference voltage having a moving value between a power supply voltage and a circuit ground with a second reference voltage having a fixed value;
    based on the comparison, determining that the first reference voltage has moved past the second reference voltage;

in response to determining that the first reference voltage has moved past the second reference voltage, generating a control signal;

delaying the control signal by a predetermined time; and providing the delayed control signal to the amplifier wherein the amplifier switches from its first mode of operation and its second operating in response to the delayed control signal.

18. The method of claim 17 wherein the amplifier is configured to provide the output signal in accordance with the first reference voltage, an input signal, and the delayed control signal, and further wherein the first mode of the amplifier comprises providing the output signal substantially equal to the first reference voltage, and the second mode of the amplifier comprises providing the output signal substantially equal to a sum of the first reference voltage and a multiple of the input signal.

19. The method of claim 17 wherein the amplifier is in a turned-on state in the first mode, and in a shutdown state in the second mode.

20. The method of claim 17 wherein delaying the control signal by the predetermined time comprises activating an oscillator to clock a counter, and in response to a time out of the counter, generating the delayed control signal.

21. An apparatus for amplifying a signal using a single power supply and a controllable gain, comprising:

means for providing an output signal using an amplifier, the amplifier being selectively operable in either a first mode or a second mode;

means for compiling a first reference voltage having a moving value between a power supply voltage and a circuit ground with a second reference voltage having a fixed value;

means for determining, based on the comparison, that the first reference voltage has moved past the second reference voltage;

means for generating, in response to determining that the first reference voltage has moved past the second reference voltage, a control signal;

means for delaying the control signal by a predetermined time; and means for providing the delayed control signal to the amplifier wherein the amplifier switches from its first mode of operation and its second operating in response to the delayed control signal.

22. The apparatus of claim 21 wherein the amplifier is configured to provide the output signal in accordance with the first reference voltage, an input signal, and the delayed control signal, and further wherein the first mode of the amplifier comprises providing the output signal substantially equal to the first reference voltage, and the second mode of the amplifier comprises providing the output signal substantially equal to a sum of the first reference voltage and a multiple of the input signal.

23. The apparatus of claim 21 wherein the means for delaying the control signal by the predetermined time comprises an oscillator to clock a counter, and the apparatus further comprises means for generating, in response to a time out of the counter, the delayed control signal.

* * * * *

UNITED STATES PATENT AND TRADEMARK OFFICE
CERTIFICATE OF CORRECTION

PATENT NO. : 6,346,854 B1
APPLICATION NO. : 09/703378
DATED : February 12, 2002
INVENTOR(S) : Christopher B. Heithoff It is certified that error appears in the above-identified patent and that said Letters Patent is hereby corrected as shown below:

In Column 11, line 30, "compiling" should be deleted and replaced with --comparing--.

Signed and Sealed this

Twenty-fourth Day of July, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,346,854 B1 | Page 1 of 1 |
| APPLICATION NO. | : 09/703378 | |
| DATED | : February 12, 2002 | |
| INVENTOR(S) | : Christopher B. Heithoff | |

It is certified that error appears in the above-identified patent and that said Letters Patent is hereby corrected as shown below:

In Column 11, line 7, "and" should be deleted and replaced with --to--.

In Column 11, line 7, insert --mode-- between "operating" and "in".

Signed and Sealed this

Twenty-seventh Day of November, 2007

JON W. DUDAS
*Director of the United States Patent and Trademark Office*